US009015542B2

(12) United States Patent
Jones et al.

(10) Patent No.: US 9,015,542 B2
(45) Date of Patent: Apr. 21, 2015

(54) PACKETIZING JTAG ACROSS INDUSTRY STANDARD INTERFACES

(75) Inventors: Keith A. Jones, DuPont, WA (US); Daniel R. Pfunder, Noblesville, IN (US); John H. Zurawski, Boxborough, MA (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 13/638,195

(22) PCT Filed: Oct. 1, 2011

(86) PCT No.: PCT/US2011/054484
§ 371 (c)(1),
(2), (4) Date: Sep. 28, 2012

(87) PCT Pub. No.: WO2013/048528
PCT Pub. Date: Apr. 4, 2013

(65) Prior Publication Data
US 2013/0124934 A1    May 16, 2013

(51) Int. Cl.
*G01R 31/28*    (2006.01)
*G01R 31/3177*    (2006.01)
*G01R 31/3185*    (2006.01)
(Continued)

(52) U.S. Cl.
CPC .... *G01R 31/3177* (2013.01); *G01R 31/318547* (2013.01); *G01R 31/31908* (2013.01); *G06F 11/267* (2013.01)

(58) Field of Classification Search
CPC ..... G01R 31/3177; G01R 31/28; G06F 11/00
USPC ............................................. 714/30, 726, 734
See application file for complete search history.

(56) References Cited

U.S. PATENT DOCUMENTS 6,205,560 B1 *   3/2001   Hervin et al. .................. 714/34
6,578,167 B2     6/2003   Boorom et al.
(Continued)

FOREIGN PATENT DOCUMENTS

WO    2013048528 A1    4/2013

OTHER PUBLICATIONS

International Search Report and Written Opinion received for PCT Patent Application No. PCT/US2011/054484, mailed on May 15, 2012, 12 pages.
(Continued)

*Primary Examiner* — Esaw Abraham
(74) *Attorney, Agent, or Firm* — Law Office of R. Alan Burnett, P.S.

(57) ABSTRACT

Apparatus and techniques for performing JTAG testing on production devices and systems through industry standard interfaces. The devices employ processors configured to receive packetized test input data from a tester over a standard communication interface such as a USB or Ethernet port and perform associated testing operations defined by the test input data, such as JTAG-compliant testing. This is facilitated, in part, via use of a bridge and one or more DFx handlers, with the bridge operating as an interface between the DFx handlers and a bus and/or interconnect over which test input and result data is transferred via the standard communication interface. The techniques enable testing such as JTAG testing to be performed on fully-assembled devices and systems without requiring the use of dedicated test or debug ports.

6 Claims, 10 Drawing Sheets

(51) Int. Cl.
*G01R 31/319* (2006.01)
*G06F 11/267* (2006.01)

(56) References Cited

U.S. PATENT DOCUMENTS

| | | | | |
|---|---|---|---|---|
| 6,601,189 B1 * | 7/2003 | Edwards et al. | ................ | 714/30 |
| 6,631,130 B1 * | 10/2003 | Roy et al. | ....................... | 370/352 |
| 6,636,515 B1 * | 10/2003 | Roy et al. | ................... | 370/395.1 |
| 6,934,898 B1 * | 8/2005 | Goff | ............................. | 714/727 |
| 7,111,217 B1 * | 9/2006 | Schultz | ........................ | 714/727 |
| 7,426,670 B2 * | 9/2008 | Steinbusch | ................... | 714/747 |
| 8,161,336 B1 * | 4/2012 | Azimi et al. | ................. | 714/724 |
| 8,347,158 B2 * | 1/2013 | Mayer | ........................... | 714/734 |
| 8,356,223 B1 * | 1/2013 | Azimi et al. | ................. | 714/733 |
| 8,539,216 B1 * | 9/2013 | Feng et al. | ........................ | 713/2 |
| 8,621,298 B2 * | 12/2013 | Son et al. | ....................... | 714/727 |
| 8,689,063 B2 * | 4/2014 | Xu | ................................ | 714/712 |
| 2004/0059973 A1 | 3/2004 | Sherman et al. | | |
| 2004/0222305 A1 | 11/2004 | Leaming | | |
| 2007/0006035 A1 | 1/2007 | Usui | | |
| 2008/0092005 A1 * | 4/2008 | Huott et al. | ................... | 714/738 |

OTHER PUBLICATIONS

International Preliminary Report on Patentability received for PCT Patent Application No. PCT/US2011/054484, mailed on Apr. 10, 2014, 8 pages.

* cited by examiner

PACKETIZING JTAG ACROSS INDUSTRY STANDARD INTERFACES

FIELD OF THE INVENTION

The field of invention relates generally to testing of devices and systems and, more specifically but not exclusively relates to JTAG testing and other types of testing of devices and systems.

BACKGROUND INFORMATION

Joint Test Action Group (JTAG) is the common name for what was later standardized as the IEEE 1149.1 Standard Test Access Port and Boundary-Scan Architecture. It was originally designed for testing printed circuit boards using boundary scan, but JTAG testing has expanded to integrated circuits (e.g., processors, controllers, etc.), embedded systems, and other components. JTAG is also used for performing debug testing of sub-blocks of integrated circuits.

Generally, JTAG testing is implemented via facilities that are built into the device being tested (commonly referred to as the Device under Test or DUT) and an external tester that connects to the DUT via a debug or test port and provides stimulus and control signals to the DUT to implement various tests such as scan tests and logic debug tests and receives test result signals and data output from the DUT. This test result data and signals can then be processed to verify the operation of the DUT. Typically, devices such as processors or Systems on a Chip (SoCs) have pins that are electronically connected to the JTAG tester via a debug port coupled to a socket the processor is mounted in. Similar debug ports may be provided at the board level, although there are instances where JTAG is used only for design debug and the production boards do not include a debug port and/or debug port connector or other type of JTAG interface.

For example, oftentimes if a debug port connector is implemented in a target system, the platform components are depopulated for production product versions. When these platforms require JTAG and run-control to diagnose potential silicon/platform/driver/software issues, it is often not possible to rework the debug port connector into the system due to rework restrictions on final product, or the potential for issues to not reproduce after the system is instrumented (often involving a full disassembly, rework, and reassembly). Moreover, debug ports and their connectors are very application specific and not configured to support standard communication. Thus, inclusion of debug ports and connectors on production devices incurs additional part and assembly cost.

In view of the foregoing, it would be advantageous to perform device testing such as JTAG testing on production devices and systems as fully assembled and enclosed in their standard chassis (e.g., laptops, notebooks, desktops, servers, or handheld devices), without requiring conventional test interfaces or debug ports, and preferably without augmenting the packaging of such devices and systems.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Embodiments of methods and apparatus for performing JTAG testing on production devices and systems through industry standard interfaces are described herein. In the following description, numerous specific details are set forth (such as use of interfaces such as Universal Serial Bus (USB)) to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In accordance with aspects of the embodiments discussed herein, techniques are provided for enabling testing operations, such as JTAG testing, to be implemented on production devices and systems using industry standard interfaces that already exist in the devices and systems. This functionality is enabled, in part, through use of an Embedded DFx Interface (ExI) that may be implemented on various types of integrated circuits, such as SoCs and processors. ExI enables closed chassis access to DFx (Design for Manufacturability, Testability and Debuggability) hooks for silicon, platform, and software debug, validation, manufacturing test, tuning, and other activities. The ExI architecture provides a flexible framework that enables a variety of hosts to access DFx resources through existing ports, interfaces, and applications. ExI introduces an extendable packet-protocol framework, and leverages existing silicon ports and busses, to create a flexible DFx-interface that bridges various host access points with DFx protocol handlers embedded within the silicon/system.

ExI Architecture Overview

Figure 1:
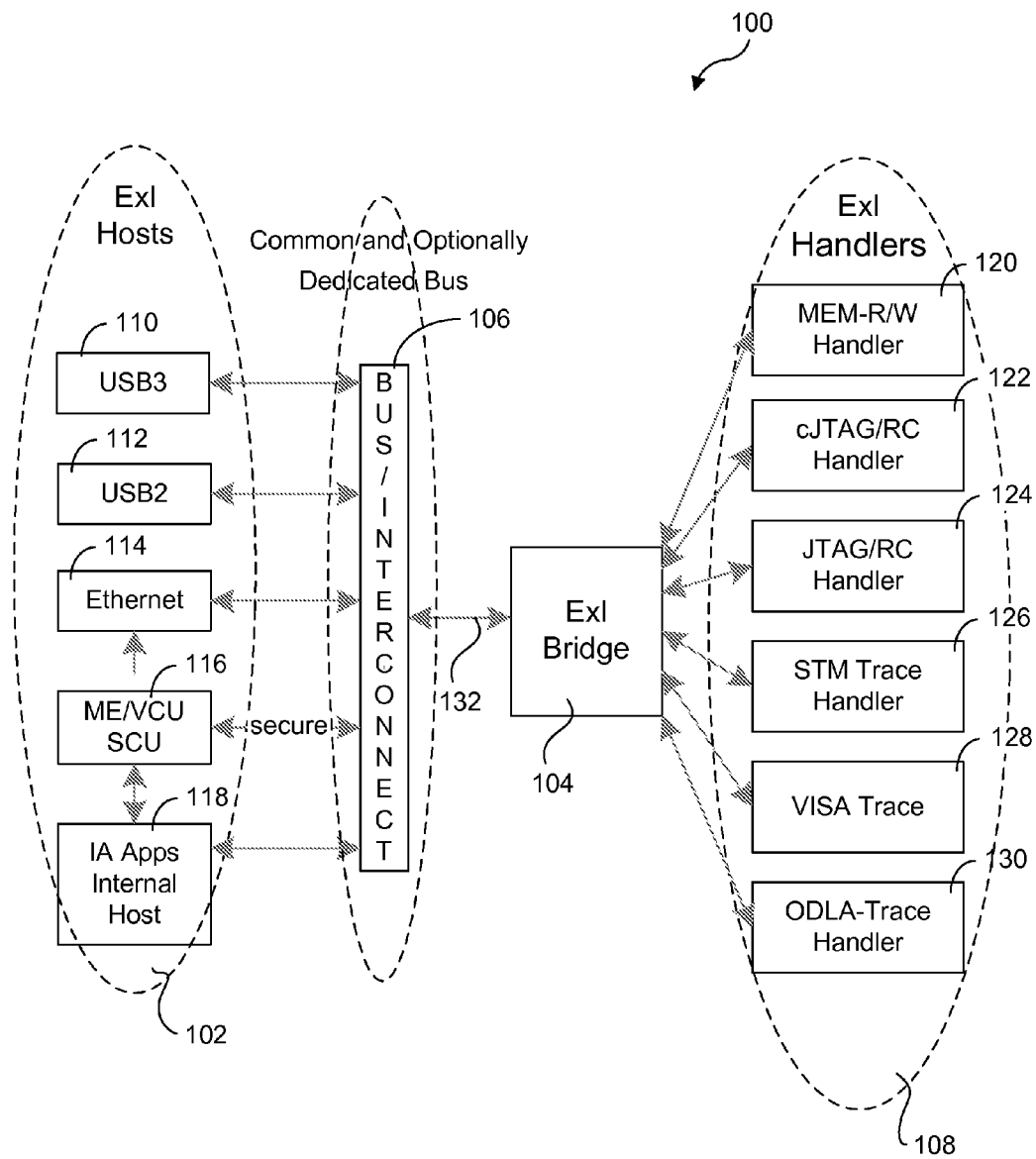
FIG. 1 is a block diagram illustrating an overview of a Embedded DFx Interface (ExI) architecture, according to one embodiment.

FIG. 1 shows an overview of an ExI architecture 100, according to one embodiment. The ExI architecture is composed of five primary components: ExI Host ports, logic, and applications; interconnect buses; ExI Bridge; ExI DFx handlers, and ExI Packet Framework. The primary components depicted in ExI architecture 100 include one of more ExI hosts 102 that are operationally coupled to an ExI Bridge 104 via a bus/interconnect 106, which, in turn is operationally coupled to one or more ExI handlers 108.

Generally, ExI hosting refers to the source through which ExI messages are passed. In theory ExI architecture can support many host types including IO (Input/Output) ports, such as USB and Ethernet; embedded applications, such as VCU (Versatile Convolver Unit), ME (Management Engine), and SCU (Secure Communication Unit); and applications running on IA (Intel Architecture) cores, such as BIOS, drivers, and operating systems. Accordingly, FIG. 1 depicts a set of exemplary ExI hosts, including a USB3 port 110, a USB2 port 112, an Ethernet port 114, and ME/VCU SCU block 116, and an IA Apps internal host block 118.

Bus/Interconnect 106 broadly encompasses various types of busses and interconnects that are used to facilitate communication between components and functional blocks in a computers systems or as embedded in SoCs or processors. These include both common (i.e., shared) busses and optionally dedicated, peer-to-peer busses. Examples of interconnect busses used in SoCs include but are not limited to OCP (Open Core Protocol) IOSF (Intel On-Chip System Fabric) and AMBA (Advanced Microcontroller Bus Architecture) interconnects. Each bus carries different attributes and therefore may have different impacts on the specific hosting logic selected. A bus or interconnect may also be generally referred to herein as an interconnect, interconnect fabric, or simply fabric. The fabrics and interconnects may be configured in a bus/interconnect hierarchy, as independent bus/interconnects communicatively coupled via bridges, and/or as ring interconnects.

ExI Hosts can reside either inside or outside silicon, but will access the ExI Bridge through a common bus or optionally, a dedicated peer-to-peer bus. External hosts may access the ExI Bridge through ports such as: USB2, USB3, and Ethernet. Internal hosts such as ME, SCU, or IA Apps may access the ExI Bridge directly through a peer-to-peer bus.

ExI Bridge 104 contains a generic addressable buffer interface that provides FIFO-style transmit and receive queues, which allows ExI Bridge and its DFx handlers to be connected to any dedicated or shared peer-to-peer bus or interface. The host sends the bridge ExI packets, representing DFx access or manipulation requests; the bridge parses and distributes ExI packet payloads to DFx handlers; and the handlers translate packet payloads into target-specific DFx signaling and semantics. Exemplary ExI handlers shown in FIG. 1 includes a memory read/write (MEM-R/W) handler 120, a cJTAG/RC handler 122, a JTAG/RC handler 124 an STM Trace handler 126, a VISA Trace handler 128, and an ODLA-Trace handler 130. The terms ExI and DFx handlers are used interchangeably herein for convenience; however it shall be understood that an ExI handler is simply a DFx handler that is configured to operate in an ExI deployment.

An ExI Bridge bus interface 132 consists of a pair of inbound (receive) and outbound (transmit) buffers and some parsing logic, to which ExI Hosts can be attached and gain access through any embedded peer-to-peer interconnect bus. The right side of the ExI-Bridge buffer logic connects to one or more DFx Handler logic modules, which can operate independently. The ExI-Bridge buffers allow intermixing of different DFx Handler traffic in a reasonably non-blocking manner. ExI packets have a defined format and protocol for parsing and processing. They provide a flexible framework to control and monitor DFx resources, and transport streams of DFx content.

USB Hosted ExI

USB is an externally accessible, industry standard IO port and communication interface available through the chassis of many computer devices. USB2 is widely deployed on many products ranging from high end servers to hand held cell phones, and the emerging USB3 variant promises rapid uptake and even larger proliferation.

Both USB2 and USB3 technologies support "BULK mode", which guarantees data integrity through CRC error detection and packet-retry algorithms. Because trusting one's tools is essential to efficient and effective debug, validation, and test, every bit is critical and cannot be treated casually. Therefore data integrity is a crucial attribute for both interactive and streaming DFx protocols like JTAG and AET/PDM [what is this?]. USB2's usable bandwidth is limited to ~32 MB/S, which is enough to support basic interactive protocols like ExI-JTAG up to 50 MHz, but considered potentially too low for many streaming trace content. USB3's usable bandwidth is 400 MB/S, which is high enough to simultaneously support a combination of multiple interactive and streaming DFx protocols.

There are various USB controllers that can host ExI: the xHCI (eXtensible Host Controller Interface) is a USB3 extended host class controller; the xDCI (eXtensible Device Controller Interface) is a USB3 extended device class controller; the EHCI (Enhanced Host Controller Interface) is a USB2 enhanced host controller. To host ExI, in one embodiment a USB controller supports the following: Provides a physical communication path between a USB controller and the ExI Bridge/handlers; Allocates inbound and outbound endpoints and buffers for ExI traffic; Connects and configures ExI endpoints and buffers to stream data in and out of the ExI Bridge inbound and outbound buffers; and fully supports USB BULK-transfers with full support for BULK retries.

ExI employs a packet-based transport scheme under which ExI-related data/commands are transferred between endpoints using packetized data. Generally, the ExI-JTAG data-packet formats are independent of their source. For example, the same packet format may be used for multiple sources, including USB3, USB2, Ethernet, etc.

Figure 2:
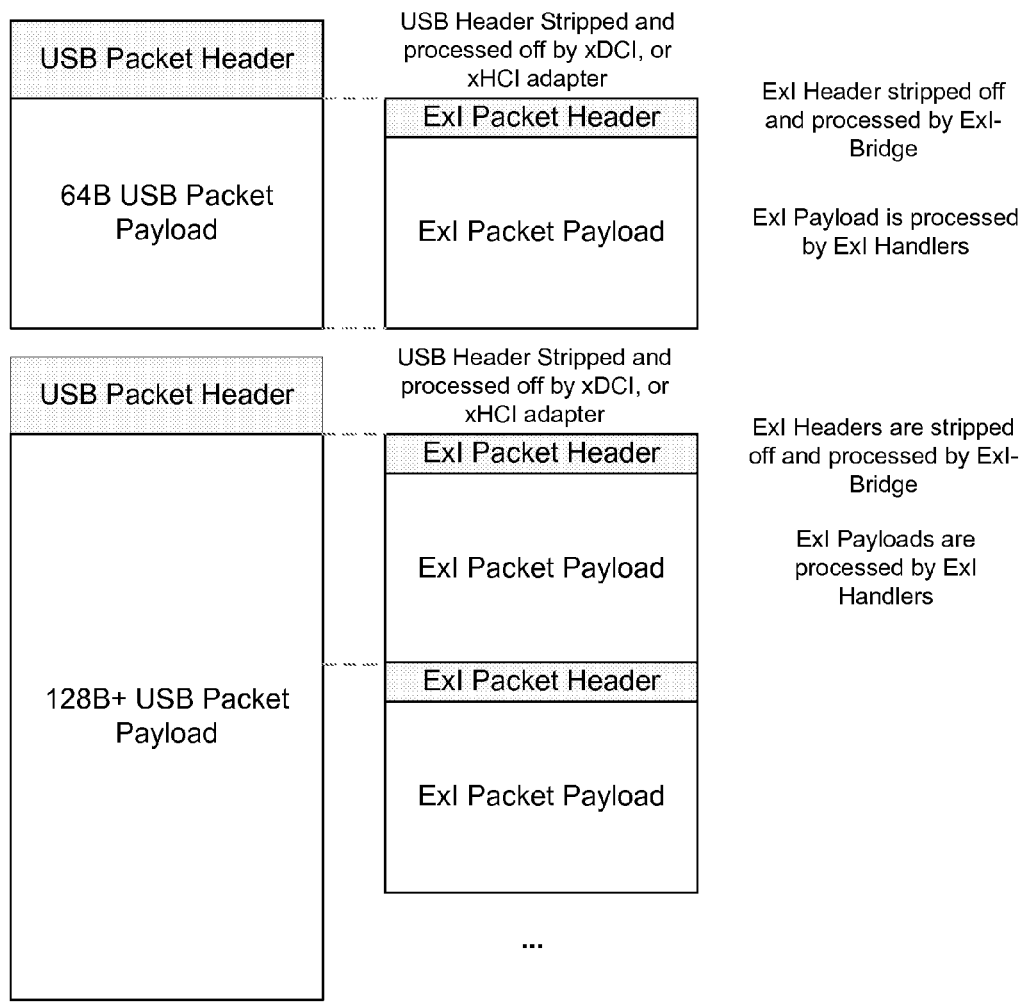
FIG. 2 shows packet formats and corresponding packet processing operations corresponding to testing employing a Universal Serial Bus interface.

Exemplary packet formats in accordance with one embodiment employing USB packets are shown in FIG. 2. In the illustrated embodiment, each ExI packet has a size of 64 bytes, which coincides with a USB packet employing a 64 byte payload. Optionally, multiple ExI packets may be sent via a single USB packet having a size of N×64 bytes, wherein N represents the number of embedded ExI packets. As each USB packet is received, the USB packet header is stripped off at the ExI Bridge, and the USB packet payload data is used to generate an ExI packet including a ExI packet header and ExI packet payload. Upon receipt of an ExI packet by an ExI handler, the ExI packet payload is processed to determine corresponding ExI/DFx handler operations.

For USB-hosting of ExI, the USB-controller inbound and outbound buffers connect to a peer-to-peer bus and drive data to, and receive data from, the ExI Bridge. This peer-to-peer bus may be a shared and/or may comprise a dedicated point-to-point interface. At a minimum two USB endpoints are required to support bi-directional communication with the ExI Bridge, and one or more ExI handlers. USB packets sent to and read from these endpoints may interleave ExI content for both interactive and streaming DFx protocols. The endpoint buffers along with the ExI Bridge buffers are sized and configured to support the combined bandwidth for applicable interactive and streaming ExI handlers, along with USB retries, up to the bandwidth limits of the USB.

Optionally, additional endpoints may be added to separate support for interactive protocols and also support high-bandwidth DMA streaming protocols. In which case, both the USB controller and the other agent support cross-DMA communication, and the DMA transfer is managed by the ExI Bridge or through DFx resources accessible through the ExI Bridge. ExI-JTAG can directly or indirectly access most DFx resources within the system, and JTAG will often be used to authenticate, configure, enable, and disable streaming DFx protocols and data-paths. In this case USB is just another data-path, which does not require any dedicated IO pins or external hardware to extract the streaming data.

Secondary endpoints may be employed for memory-accesses and streaming protocols where packets can be directly written to and read from USB buffers. If the data is already transmitted across a peer-to-peer bus, inserting the ExI Bridge in the middle of the path doubles the bandwidth impact of the stream on the bus, while increasing the silicon resources needed to capture and forward the data through the bridge. There may be other cases where distributing ExI Bridge resources may also be advantageous.

At power-on, the default configuration of the endpoint buffers should send data to, and receive data from, the ExI Bridge; to enable basic debug access to silicon as early in the power-on sequence as possible. Any hardware logic or software application that manages USB should allow the USB controller to continue buffering data to and from the ExI Bridge without interruption; point the endpoint buffers to the ExI Bridge any time they are no longer in use; and point the endpoint buffers to the ExI Bridge any time a properly configured host is connected.

Validation or management cores residing on the target silicon or applications running on the target silicon can host ExI by forming ExI packets and writing inbound data packets directly to, and reading outbound packets directly from the ExI Bridge. This capability may allow BIOS or resident applications or boot CPUs to monitor or modify general operation flows during normal operation. For example if TAP, or other ExI accessible resources, provides power and performance metrics, then a resident IA application could monitor battery usage, CPU performance, or monitor thermal cycling while a user develops and tunes applications.

The ExI Bridge interface consists of inbound and outbound buffers, connected and accessed through a common silicon bus (e.g., OCP, IOSF/IOSF-SB, etc.). Any validation processor within the silicon (VCU/ME/VE/SCU), that is able to access addressable hardware resources within the silicon, can host ExI by writing ExI's inbound and receive data from ExI's outbound buffers. One opportunity may be to utilize a validation processor's access to ExI to patch or work-around silicon bugs, through JTAG access, which otherwise might drive a silicon recall. Another proposal is to use the VCU/SCU to assist in validating the ExI resource.

The SoC SCU is an imbedded management controller that can address and access any resource on the OCP bus. As a result, the SCU code may be updated to enable the SCU to transfer ExI packets to and from the ExI Bridge, providing the SCU access to any ExI DFx resource attached to the ExI Bridge (like JTAG and run-control).

The VCU (Validation Control Unit) is a resident validation processor core imbedded on the processor core. The ME (Management Engine) is a validation control unit resident on a PCH (Platform Controller Hub). Both validation control units can work together to access and manipulate DFx resources within a client or server system. Since each controller can address and access IOSF and IOSF-SB resources, they have an opportunity to access any ExI resources attached to the ExI Bridge.

"Remote" ExI hosting utilizes encryption/decryption, Ethernet, and VCU resources to provide secure communication between a host and a target that may not reside in the same vicinity. Once secure communication has been established, the VCU can authenticate the host and the user, and provide control access to DFx hooks based on the level of authentication. Remote is an option for Client, Server, and some SoC designs.

Host-to-Bridge Peer-to-Peer Communication Busses

Bus selection is important because it potentially impacts the usefulness of different hosting logic. OCP, IOSF, IOSF-SB are shared peer-to-peer busses, where the overall bus bandwidth must be shared between ExI-content and other system or debug content, but it opens general ExI hosting access to resources throughout the silicon and system. Shared peer-to-peer busses allow flexibility for hosting ExI. Any resource that can format ExI content, and address and interact with the ExI Bridge across a common shared peer-to-peer bus, can be used as an ExI Host.

In one embodiment, the ExI Bridge resides on a common peer-to-peer bus such as OCP, IOSF, or IOSF-SB. The bridge-to-bus interface consists of addressed inbound and outbound buffers. The ExI Bridge may be connected to more than one bus to improve accessibility and data-integrity between the hosts and ExI Bridge. The host compiles packets of DFx content and writes it into the ExI Bridge inbound buffer; the ExI Bridge strips off and processes the inbound packet header(s), and forwards the payload(s) into the proper inbound ExI handler. Inbound ExI handlers convert each payload-packet into a specific DFx protocol or data-stream. Outbound ExI handlers accumulate outbound DFx data-content or data-streams into outbound packets, which are then written into the ExI Bridge outbound buffers. The ExI Bridge prepends an outbound packet header, and then forwards the packet to the host.

OCP is a high-performance bus available on some SoCs. In one embodiment, the thread 0 data channel of the OCP bus is employed since the message/command control of this thread 0 data channel is "grounded" so that it will not lockup, and the thread is not heavily used for other system transfers. This allows for a robust data-path between the host (e.g., xDCI) and the ExI buffers. OCP intrinsically provides backpressure so that data will not be written or read unless space is available to accept the data.

IOSF is a high-bandwidth bus available on most IA Client, Server, and SoCs. IOSF is an extremely high-bandwidth data-bus designed but not validated for support full peer-to-peer communication; high-bandwidth posted-reads may have potential corner-cases problems in the protocol. In one embodiment, an xHCI debug-class connection to IOSF is implemented as a high-bandwidth DMA path for reading and writing system-memory through USB. This DMA feature may be deployed to re-enable Kernel mode debuggers, previously supported through legacy serial-ports. Once validated, this DMA path can be leveraged by the ExI host for initializing and extracting memory, and extracting any trace contents that can be re-directed into memory.

IOSF-SB (Sideband) is a much lower bandwidth peer-to-peer interface than OCP or IOSF, and is often lightly used, except during debug and validation. The low-bandwidth limitations make it a poor candidate for TRACE, moderately tolerable for memory transfers, but the bandwidth is adequate for run-control when dedicated to ExI-JTAG.

Although OCP, IOSF, and IOSF-SB are presented herein as examples of shared busses, ExI can reside on any other shared and/or dedicated peer-to-peer bus that can provide read and write access to ExI. Dedicated busses may make sense for Ethernet or any other industry standard communications ports.

The core of ExI is the ExI Bridge, which comprises a flexible protocol/content bridge that mediates between host messages and DFx protocols and resources distributed throughout the target silicon. This allows ExI to become a high-performance, in-chassis DFx bridge for debug, validation, manufacturing test, application power and performance tuning, and other purposes.

The ExI Bridge may be configured to support various protocols, including: Interactive DFx protocols such as:
JTAG (1149.1 and 1149.7-T3)
Star2/2-wire and Star4/4-wire cJTAG (1149.7-T4N/T5W)
I2C, SMBus, SPI, UARTs, SPI, and others
Streaming DFx protocols that can initialize or extract silicon or software state, such as:
Memory Read/Write
Control Register Read/Write
Tracing technologies such as VISA, NOA, ODLA, RTIT, IOT, AET The ExI Bridge logic's role can be described at a high level. Different "host" logic instances are enjoined to the ExI Bridge over a common interconnect bus and through parsing and translation associated with DFx Handlers. Embedded in the ExI Bridge are a set of transmit and receive buffers arrayed as FIFOs. Hosts issue messages containing DFx control protocols over physical IO interfaces interconnecting them to the ExI Bridge. The ExI Bridge's role is to parse those messages, examine their headers, and redirect message payloads to the appropriate DFx Handlers for further processing. DFx Handlers parse inbound message payloads and interpret them and replay them as semantically correct operations on the DFx interface that each controls.

Figure 1A:
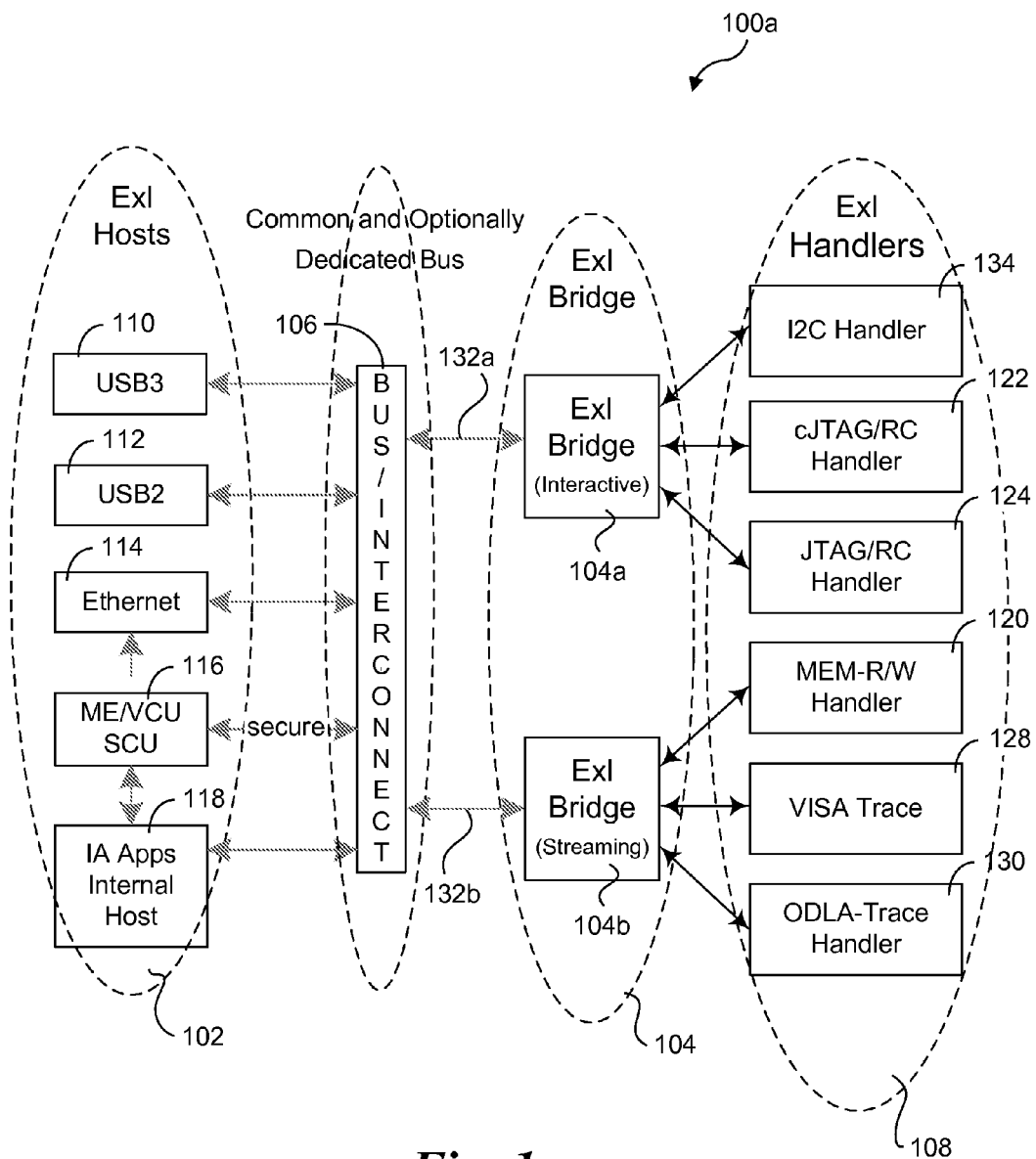
FIG. 1a shows an augmentation of the ExI architecture of FIG. 1 under which ExI Bridge operations are implemented via multiple ExI Bridge components.

The ExI Bridge can be unified into a single functional module (as shown in FIG. 1), or optionally distributed (FIG. 1a) into two or more modules as long as the functional combination of all modules maintain the proper bridge functionality. In further detail, FIG. 1a shows an ExI architecture 100a under which the ExI Bridge 104 functionality is facilitated via an interactive ExI Bridge 104a and a streaming ExI Bridge 104b. The interactive ExI Bridge 104a functions as an interface to support interactive testing, as depicted by an I2C handler 134, cJTAG/RC handler 122, and JTAG/RC handler 124. Meanwhile, streaming ExI Bridge 104b functions as an interface to testing modules and functions that perform more stream-oriented testing, such as depicted by MEM-R/W handler 120, VISA Trace 128, and ODLA-Trace handler 130.

Combining all bridge functionality into one physical location within the silicon may minimize the amount of silicon required to enable ExI, but if silicon resources are distributed, it may require a large number of routing paths across the chip. Distributing the bridge may invoke additional buffering and duplication of some management logic in each module, but it may minimize routing or bandwidth issues on the silicon.

For example, USB hosting may allocate two pairs of endpoints: an in and out for relatively low-bandwidth interactive protocols; and an in and out endpoints for high-bandwidth memory transfers and trace content. The interactive endpoints may be combined onto a single bridge where large routing resources are not required. The high-bandwidth memory and trace paths may have a more direct path from the USB controller through a separate dedicated or high-bandwidth memory interface. In this example, the each segment of bridge will have separate inbound and outbound buffers, each with separate addressing. This may be especially useful if more than one USB ports are to be connected to interact and extract ExI-content from the silicon.

In, another example, a designer may duplicate the inbound and outbound buffers, duplicate the parsing blocks, and add some arbitration logic between bridge sections. This would allow each bridge section to only respond to local DFx handler traffic. This distributed design requires additional arbitration manage multiple data-sources interfacing to one host interface. This duplication of bridge resources could allow one pair of endpoints to send and receive content to/from handlers distributed across the silicon. This may make sense when the common shared bus is already routed across the chip, where duplication of resources is considered lower risk than impacts to routing or bandwidth to forward the content through a common point on the fabric.

Figures 3, 4, 5:
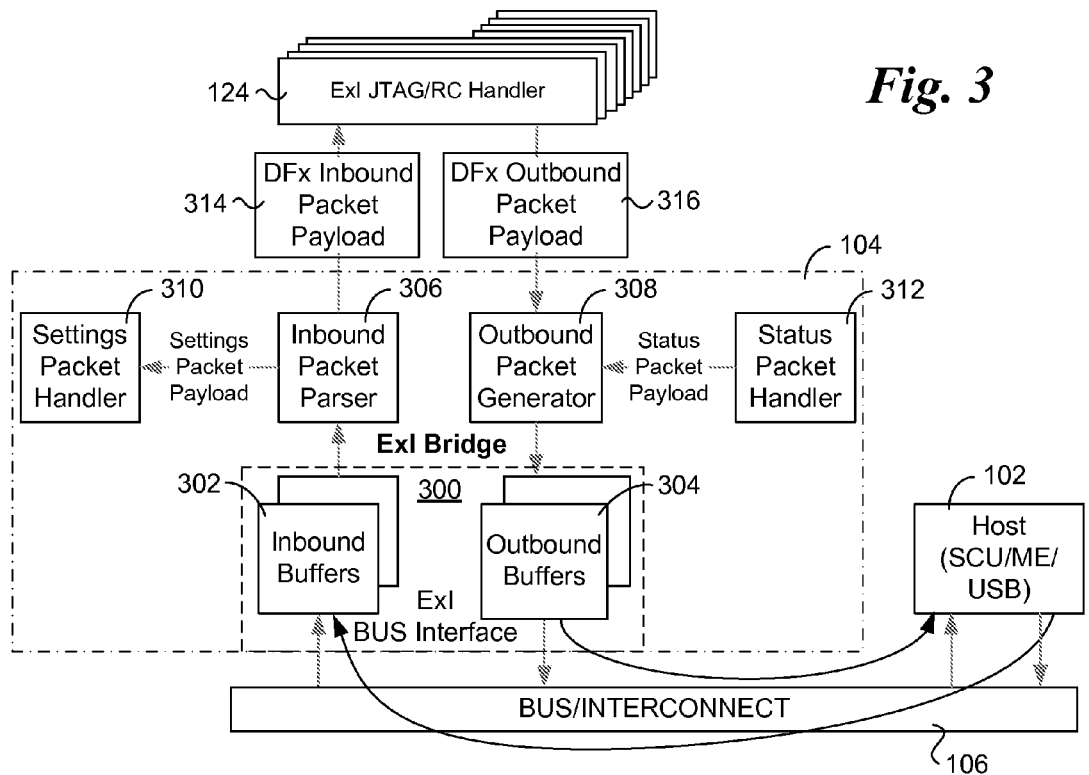
FIG. 3 is a block diagram depicted selected components of an ExI Bridge, according to one embodiment.
FIG. 4 shows a common header framework for inbound ExI packets, according to one embodiment.
FIG. 5 shows a common header framework for outbound ExI packets, according to one embodiment.

FIG. 3 shows selected ExI Bridge components relating to packet handling operations. ExI Bridge 104 includes an ExI bus interface 300 including a set of inbound buffers 302 and outbound buffers 304. ExI Bridge 104 also includes an inbound packet parser 306, an outbound packet generator 308, a settings packet handler 310, and a status packet handler 312.

In further detail, inbound buffers 302 (also referred to as receive buffers) receive and pipeline ExI packets from the ExI host, preserving the arrival order in one embodiment. Inbound packet parser 306 strips off and processes each ExI packet header, and forward the packet payload to the appropriate inbound ExI handlers, as depicted by DFx inbound packet payload 314 being sent to ExI JTAG/RC handler 124. Outbound packet generator 308 attaches ExI headers to DFx outbound packet payloads 316, and forwards or places the packets in outbound buffers 304 (also referred to as transmit buffers). Settings packet handler 312 configures the ExI Bridge and other DFx handlers. Status packet handler 316 tracks ExI and system state, packetizes state data and events into Status packets, and returns this information to ExI host 102 via bus/interconnect 106.

In addition to the inbound and outbound buffers 302 and 304, ExI bus interface will include interface circuitry and components for facilitating interconnects to bus/interconnect 106 that are appropriate for the one or more types of interconnect protocols used in the system for communication between an ExI host or hosts 102 and ExI Bridge 104. For example, if bus/interconnect 106 employs OCP, then ExI bus interface 300 will include interface circuitry and components for transfer and receipt of OCP packets over an OCP interconnect.

The size of the ExI buffers and the host-interface buffers should allow and maintain reliable data flow between the host and the ExI Bridge. The buffers should match the bandwidth of hosts to the bandwidth of the supported handlers, and have enough overhead to keep the ExI buffers serviced around the worst case cycle times of the host and the peer-to-peer bus. For example, to stream trace through ExI outbound buffers, and through a USB3 port at the full usable bandwidth of 400 MB/S, requires buffers that will keep the USB endpoint-buffers full enough to keep each available USB micro-frame transferring data, while additionally retaining a copy of each packet until the corresponding USB transaction successfully completes and is acknowledged. In one embodiment 64-byte buffers are used, matching the size of typical OCP and IOSF packets.

In one embodiment, at least two inbound buffers 302 are employed, so that one can always be filling from the host, while the data in the other is being transferred to the appropriate handler. Inbound ExI buffers receive data from the host across a shared or dedicated peer-to-peer bus. It is possible, especially with ME/SCU ExI-hosting that the ExI inbound buffers will be relatively slow to fill, compared to being filled by IOSF or OCP. Regardless of the host or its bandwidth, in one embodiment the packets are completely loaded into the inbound buffer before a single bit is be processed or forwarded by the packet parser. If the inbound buffers fill up, backpressure is applied back to the host to guarantee reliable data flow into ExI. IOSF and OCP protocol provides backpressure by not allowing data to be transferred unless space is ready to accept the data.

Depending on the common bus architecture's ability to guarantee data integrity, packets in the ExI outbound buffer 304 are either read by the host or posted by the ExI Bridge to the host. The IOSF peer-to-peer operations may have high bandwidth corner-case conditions, where posted reads could hang the bus. To minimize this risk, posting the outbound data back to the host, instead of reading it may be required. The size and structure of the outbound buffers must be architected to support the throughput requirements of all handlers connected to ExI, and be able to guarantee that no data is dropped between the host and any of the handlers. At least two outbound buffers are required, to maintain steady ExI Bridge data flow. As with the inbound buffers, in one embodiment outbound buffers 304 comprise 64-byte buffers.

FIG. 4 shows details of a common header framework for inbound ExI packets, according to one embodiment. The use of standard inbound packet headers enables the Packet Parser to identify and re-direct the packet-payloads to the appropriate ExI-handler, and track packet interactions. Inbound packet headers define: bit 0 as "Valid bit"; bits 7:1 as "Packet-type"; bits 15:8 as "Packet-ID"; bit 16 as "Force Status"; bit 17 as "Force Output"; bit 31 as "Extend Header" to extend the header by 4 bytes; bits 30:17 are reserved for specific handler requirements. When "Extend Header" is set, inbound headers are extended and: bits 62:48 contain "Payload bit-length", and bits 47:44 are optionally for "CRC" error checking Bits 43:32 are reserved for protocol specific handler required features.

Similarly, in one embodiment outbound ExI packets have a common header framework, as shown in FIG. 5. Utilizing standard outbound packet-headers enable the ExI host to distinguish ExI packets from each handler in the system; to deterministically track handler operations, interactions, and outbound data content. Outbound headers define: bit 0 as a packet "Valid-bit", bits 7:1 as the current "Packet-type", bits 15:8 as the current "Packet-ID"; bits 30:24 as the most recent "Settings Packet-ID", bit-23:16 as the most-recent "Message Packet-ID", and bit 31 bit 31 as "Extend Header" to extend the header by 4 bytes. When the outbound headers are extended, bits 62:48 contain "Payload bit-length", and bits 47:44 are optionally for "CRC" error checking Bits 43:32 are reserved for protocol specific handler required features.

The ExI packet size can optimize data transfers around the silicon architecture to meet the specific bandwidth expectations. The ExI specification allows silicon architecture to support ExI packet sizes between 16-bytes and 4 K bytes, typically targeting 64-byte endpoints, packets, and buffers for interactive protocols like ExI-JTAG; targeting 1 KB endpoints, packets, and buffers for high-bandwidth content like memory-read/write and Trace. Larger packets increase the bandwidth of ExI, and minimize packet overhead. Smaller packets reduce the silicon gate requirements, reduce the size of inbound and outbound buffers, and minimize inefficiencies of poorly-packed DFx protocols within packet-payloads. Initial ExI silicon design are standardizing on 64 Byte packets to match standard transfers across the USB, OCP, IOSF, and ExI Bridge. Although a default size is defined, ExI-settings provide an option to override the architectural defaults.

Inbound packets are generated by the host, transferred across a host-port and the common bus, and into the ExI Bridge, where the packets are processed in the same sequential order they were generated. This packet-order guarantees determinism within the validation flow, the ExI-framework, and within each DFx handler. To verify determinism: each packet header contains an incrementing packet-id that is returned in each outbound write-back and status-packet. This allows the host to verify that the packet processing order, and identify if any packet were dropped, or identify the state of each handler in when a problem arises.

The following examples describe the effect of in-deterministic packet processing on a DFx Protocol, and between DFX-handlers:

ExI-Settings packets modify the configuration of the ExI Bridge and DFx handlers; if a settings packet were to be processed before completely processing a prior DFx packet, then the configuration of the DFx-handler could change in the middle of a DFx protocol sequence.

ExI memory may be used to initialize memory, ExI-I2C may be used to configure target clocks and voltages, ExI-JTAG is often used to setup and initiate a test sequence. If packets arrive or are processed by handlers out of order, then test could be started prior to the system being properly configured.

Outbound packets contain handler-IDs and packet IDs to allow the host to categorize and process packets in order for each handler. The Packet-Generator attaches the header and load the packets into the outbound buffer in the order they are received from the DFx-handlers.

The purpose of Inbound Packet Parser 306 is to identify valid inbound ExI Packets, parse them, and route the packet payload to either settings packet handler 310 (ExI configuration logic) or one of the DFx Handlers. The packet parser also performs simple operations that are common to all packet types.

The ExI protocol defines four major packet types: Settings, message, write-back, and status packets. The general decision logic followed when parsing packets is as follows:

1. The Packet-Parser:
   a. Receives new packet header from inbound buffer.
   b. Verifies the packet is valid (Valid-bit=1 and PKT-TYPE is recognized and the DFx handler is enabled); discarding any packets that are not valid, and reporting the error to the host through Status (Bits 1:0 in Bridge-State— Table 11).
   c. Stores the Packet-ID, Settings-ID, Message-ID, payload-length and force-bits from valid packet headers.
   d. Redirects the packet-header and payload to the DFx-handler addressed by PKT_TYPE, when the handler has completed processing the previous packet. Standard PKT_TYPE Handler addresses are defined in section 3.8.4.

2. The DFx-handler:
    a. Processes any Protocol-specific header bits.
    b. Processes the packet-payload or payload-length bits of the packet-payload if the header is extended.
    c. Stall processing of the packet-payload, when back-pressure is required.
    d. Initiates Status and write-back packets when packet-payload is fully processed.
        i. Force a Status Packet when enabled through Settings.
        ii. Force a Status Packet when the "S" header bit was set for the packet
        iii. Force a Outbound/Writeback packet(s) corresponding to "Force bit(s)" in the packet-header.

Figure 6:
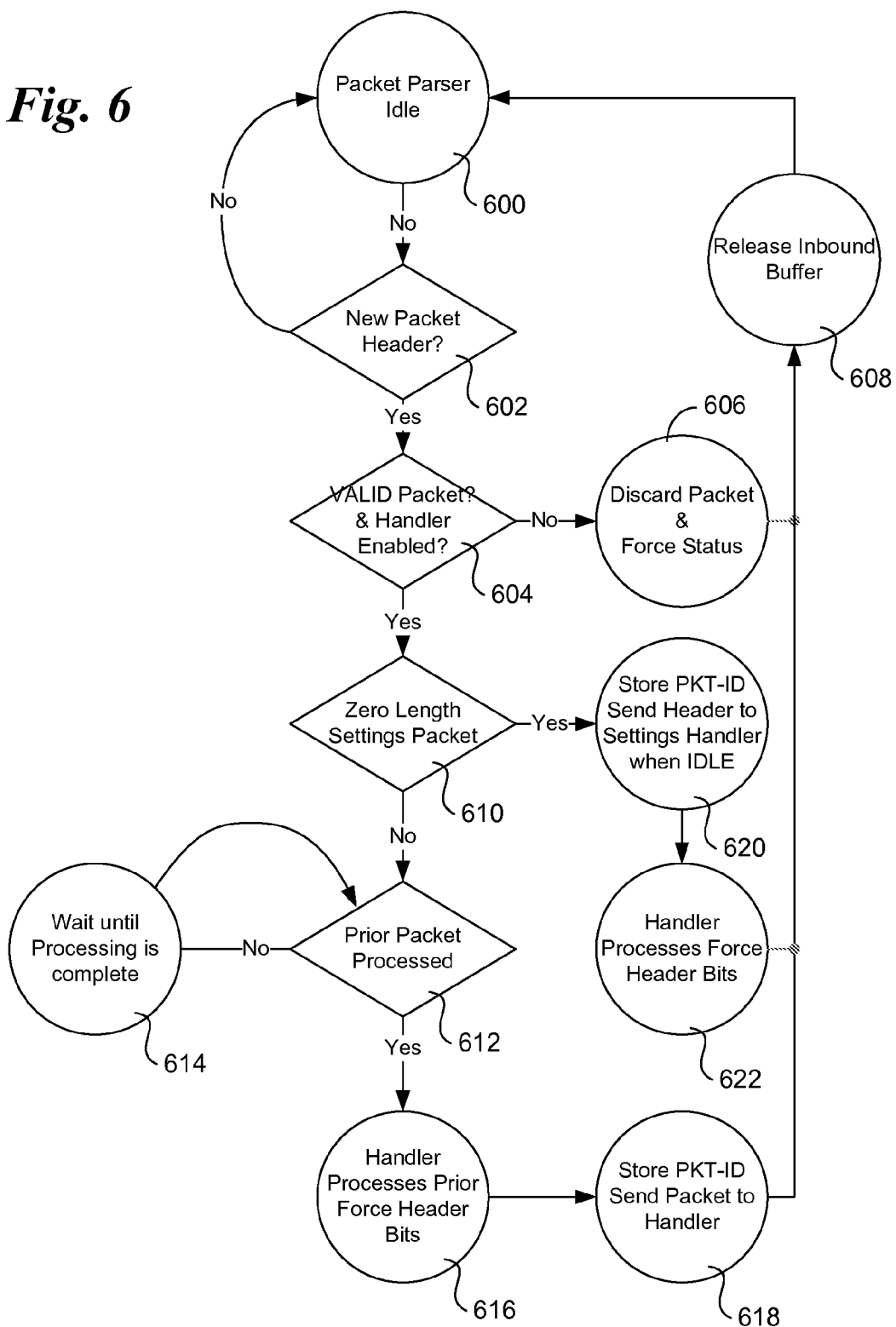
FIG. 6 is a parser packet flow diagram, according to one embodiment.

FIG. 6 is a parser packet flow diagram, according to one embodiment. The diagram begins at a packet parser idle state 600, which in conjunction with a decision block 602 depicts ongoing checking of arriving (for processing from an inbound buffer) packets. In response to receipt of a new packet (identified by its packet header in decision block 602), a determination is made in a decision block 604 to whether it is a valid packet and the corresponding handler (for which the packet is destined) is enabled. If not, the packet is discarded and a force status is invoked at state 606, and the inbound buffer is released at state 608.

If the packet is valid and the destined handler is enabled, the process flows to a decision block 610 to determine whether the packet is a setting packet. If not, the process proceeds to a decision block 612 and a process state 614 indicating that a most recent packets is not processed until processing of the immediately prior packet is completed. Once this processing is done, the process flows to a state 616 during which the settings packet handler processes the prior packet and force header bits, followed by a state 618 during which the packet ID is stored and the packet is sent to the applicable packet handler. The state is then returned to state 608, releasing the inbound buffer.

Zero length setting packets are used to extract system and handler state, without corrupting processor state. Accordingly, upon recognition of a zero length setting packet in decision block 610, the process proceeds to a state 620 during which the packet ID is stored, and the header is sent to the settings packet handler when IDLE, and then proceeds to a state 622 during which the settings handler processes force header bits, and the processes is then returned to state 608, releasing the inbound buffer.

Figure 7:
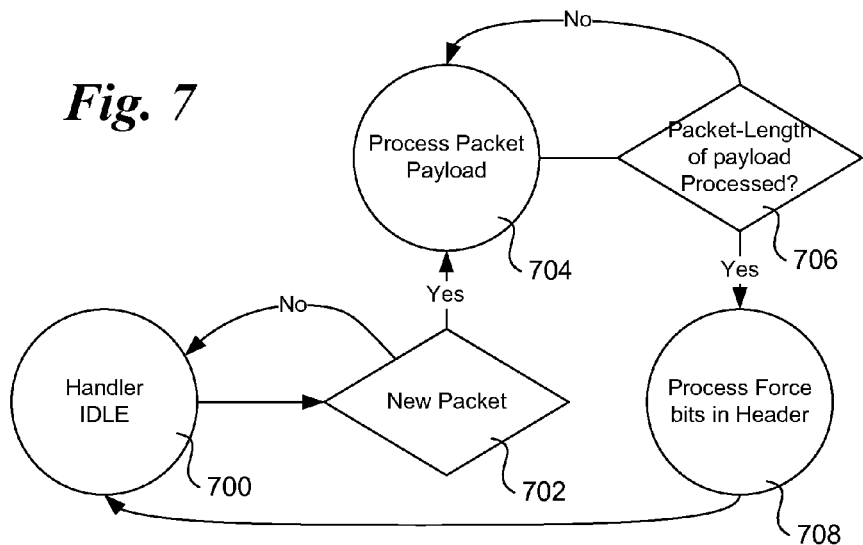
FIG. 7 is a settings handler packet flow diagram, according to one embodiment.

FIG. 7 shows a settings handler packet flow diagram, according to one embodiment. The process state begins with the handler in an IDLE state 700, with a check for new packets depicted by a decision block 702. Upon identification of a new packet, the packet payload is processed until the entire packet length has been processed, as depicted by a state 704 and a decision block 706. Upon completion of processing, the process Force bits in the header are set at state 708, and the state is returned to the IDLE state 700.

DFx handlers guarantee processing of inbound DFx packets, or discard hung packets that can't be processed. Timeouts are often used to detect and resolve hand conditions, or disable the handler and discard unprocessed payloads. Any time, packet-contents are discarded instead of processed, handlers are disabled, or triggers are overridden to keep the handler from hanging ExI, the host are notified through Status.

Figure 8:
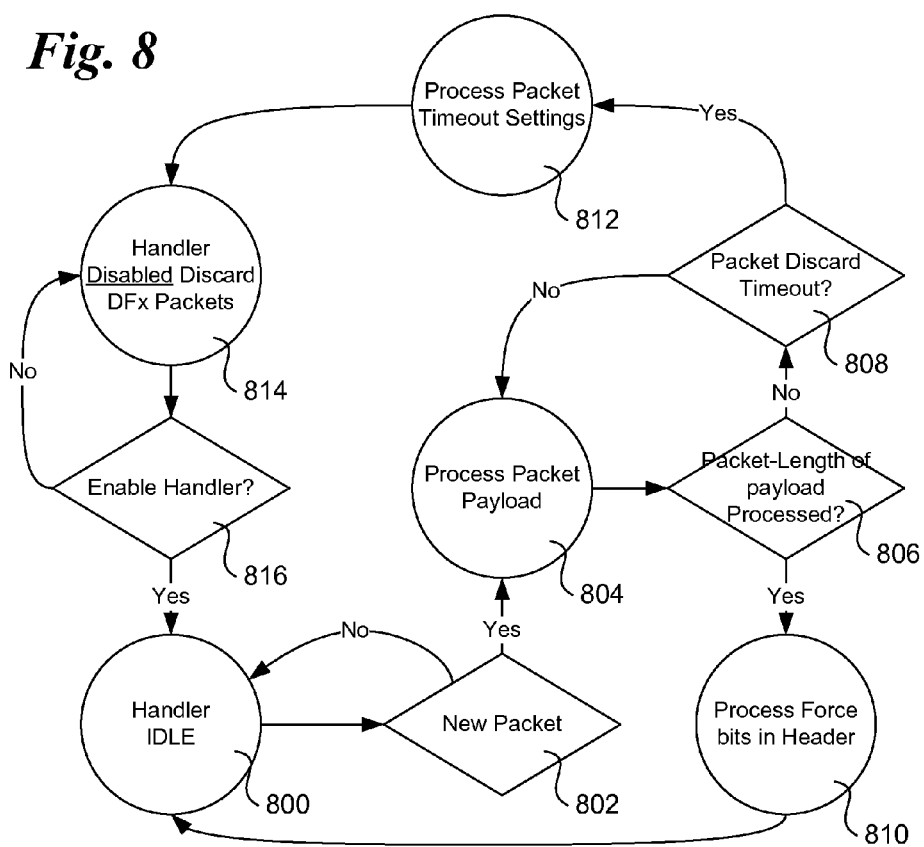
FIG. 8 is a DFx handler packet flow diagram, according to one embodiment.

FIG. 8 shows a DFx handler packet flow diagram, according to one embodiment. The process state begins with the handler in an IDLE state 800, with a check for new packets depicted by a decision block 802. Upon identification of a new packet, the packet payload is processed until the entire packet length has been processed or a packet discard timeout occurs, as depicted by a state 804 and decision block 806, and 808. Upon completion of processing, the process Force bits in the header are set at state 810, and the state is returned to the IDLE state 800. Conversely, if a packet discard timeout occurs prior to completion of packet processing, the process flows to a state 812 in which the packet timeout settings are processed. The handler is then disabled and the DFx packets are discarded at a state 814, with a decision block 816 and corresponding loop depicting the state being returned to the IDLE state 800 upon the handler being re-enabled.

The ExI Settings packet handler 310 receives the packet header from inbound packet parser 306, and receives the Packet-payload from the ExI Bridge inbound buffers 302 (redirected by the packet-parser). Settings packets configure operation within the Bridge and DFx handlers. Settings packets utilize a flexible header payload structure. The standard settings header fields are defined under the inbound packet header framework (FIG. 4); in one embodiment some additional reserved header bits are assigned to force outbound packet from interactive ExI protocol handlers.

The ExI status packet handler 312 is responsible for collecting status for the ExI Bridge, for each of the ExI handler(s), and any system status that may be useful during debug or validation. The ExI Status packet handler loads a snapshot of this system and ExI state into an outbound buffer 304 for delivery to the host. In one embodiment the "S" bit in settings and message packet headers is used to force the status packet handler to snap-shot the current state, and load the status packet into an available output buffer for the host.

Status packets can be generated quickly (when requested) by collecting status content from local registers and placing the data into the packet format. When the outbound buffers are full and a new status packet cannot be loaded, the status handler will continue to accumulate status, and hold off servicing the status generation-request until the outbound buffer is available to receive the requested packet.

ExI DFx Handlers

As discussed above and shown in FIGS. 1 and 1a, various DFx handlers can be connected to the ExI Bridge (and thus are alternatively referred to as ExI handlers). The DFx handlers may include one or more of the following:

Interactive DFx Handlers—Generate interactive DFx protocols using inbound packet payloads, and pack outbound protocol data into outbound packet payloads.

JTAG Packet Handler

Enables access to all TAP based DFx resources residing on internal and external JTAG chains in the system.

Provides access to processor side-band signals that enable basic execution control such as probe mode entry and exit, breakpoint, single step Converts ExI-JTAG inbound packets into IEEE 1149.1 and IEEE 1149.7-T0 compliant IR and DR JTAG scan sequences, packs JTAG write-back data into ExI-JTAG outbound packets, triggers on and hand-shakes JTAG scans on and around system events.

cJTAG-Star2 Packet Handler

Converts ExI-cJTAG-Star-2 inbound packets into IEEE 1149.7-T0-T4N,T5N compliant scan sequences, packs JTAG write-back data into ExI-JTAG outbound packets, triggers on and handshakes JTAG scans on and around system events. This handler enhances ExI-JTAG functionality and the two handlers can share many of the same functional blocks.

cJTAG-Star4 Packet Handler
  Converts ExI-cJTAG-Star4 inbound packets into IEEE 1149.7-T0-T4W,T5W compliant scan sequences, packs JTAG write-back data into ExI-JTAG outbound packets, triggers on and handshakes JTAG scans on and around system events. This handler enhances ExI-JTAG and ExI-cJTAG-Star-2 functionality and all three handlers can share many of the same functional blocks.
I2C Packet Handler
  Converts ExI-I2C inbound packets into I2C or SMBus compliant operations, returns I2C or SMBus read data back to the host.
SPI Packet Handler
UART Packet Handler
Streaming DFx Handlers—
  Memory Read/Write Handler
  Trace Packet handlers
  RTIT Trace Handler
  VISA Trace Handler
  ExI JTAG/RC Handler The ExI-JTAG/Run-control handler (i.e., illustrated as JTAG/RC handler 124 herein) translates ExI encoded JTAG and cJTAG packets payloads into 1149.1 and 1149.7-T0 compliant serial JTAG protocol scans protocols. JTAG is a 4/5 wire signaling protocol that is used for debug, validation, and test within silicon, and between chips within a system. JTAG signals include: TCK (Test Clock), TMS (Test Mode Select), TDI (Test Data In), TDO (Test Data Out), and optionally TRSTn/pdtrst (Test Reset/Test Reset pull-down).

The ExI JTAG/Run-control handler supports various 1149.1 and 1149.7-T0 JTAG chain Topologies. Each JTAG/RC handler instance is able to source up to 16 TAP-chains. The TAP-chains can be routed in parallel or share pins. A "Common TAP Chain Topology" has one or more devices connected together where each device in the chain is connected to a common TCK, TMS, and TRSTn; and where TDI and TDO are daisy-chained, looping through each device and returning to the DTS. A "Shared TAP Chain Topology" has one or more devices on each of two chains, where TMS and TRSTn are routed to all devices on both chains; where there are two sets of TDI/TDO loops daisy-chaining through each device in separate chains, but both TDIs and TDOs are connected to the same pin on the DTS.

ExI "Alternate TAP Chains," represent additional Common TAP chains or Shared TAP chains routed in parallel, where with distinct TCK, TMS, TDI, TDO, and TRSTn signals. A single ExI JTAG-handler is capable of supporting up to 15 TAP chains. In addition to hosting each chain through ExI, they may also be hosted through a board level debug-port.

Figure 9:
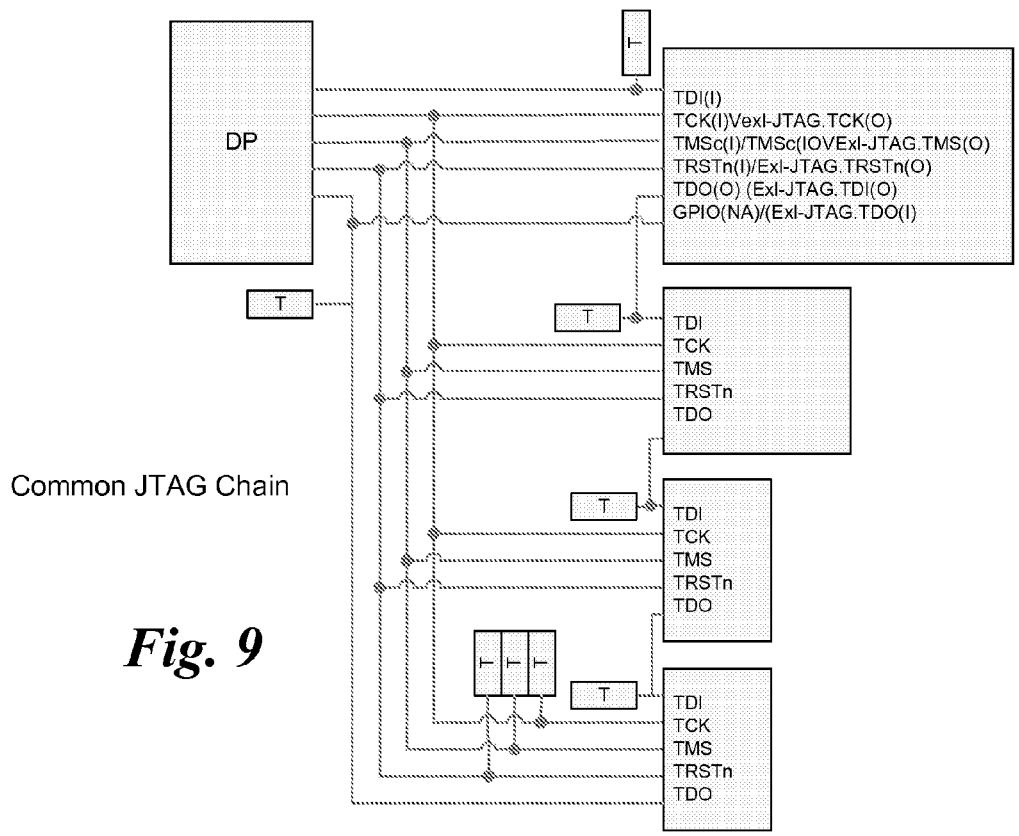
FIGS. 9 and 10 illustrate example usages of common JTAG chains.
Figure 10:
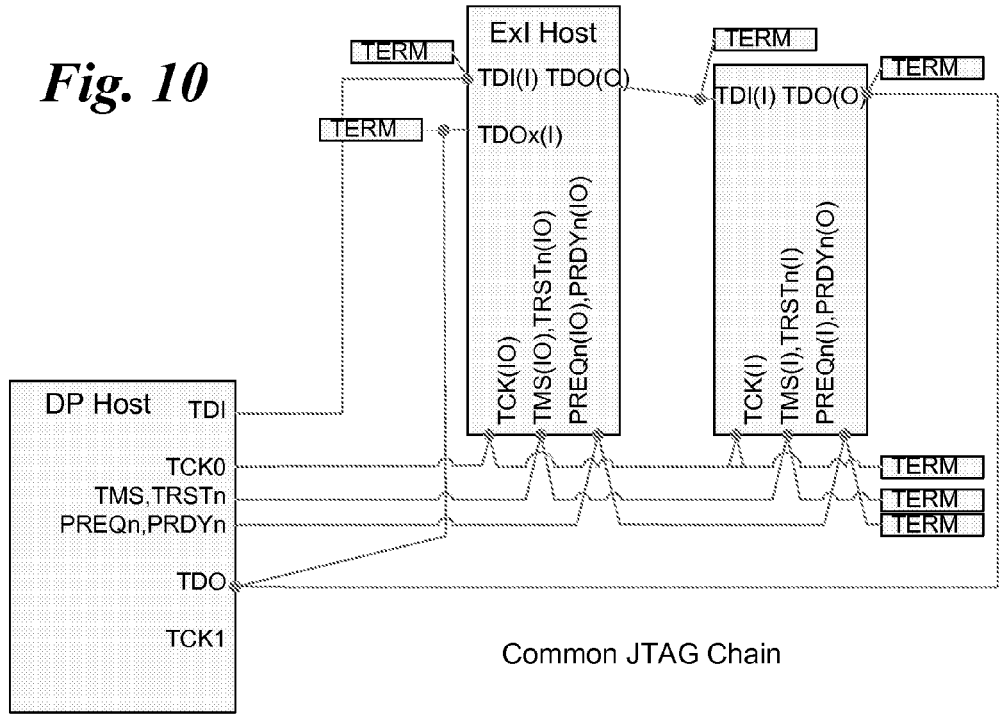

FIGS. 9 and 10 illustrate examples of usages of a common JTAG chains. ExI-JTAG can master 1149.1/1149.7-TO 4/5-Serial JTAG in the silicon and on the board. If mastering of the devices on a common JTAG-chain is required, then ExI-JTAG drives TCK, TMS, TDO (as TDI), and receives data on TDOx (a GPIO). The diagram below shows a common chain configuration where the board-level chain is mastered by either the debug port (DP) or by the first device in the chain through ExI-JTAG.

Figure 11:
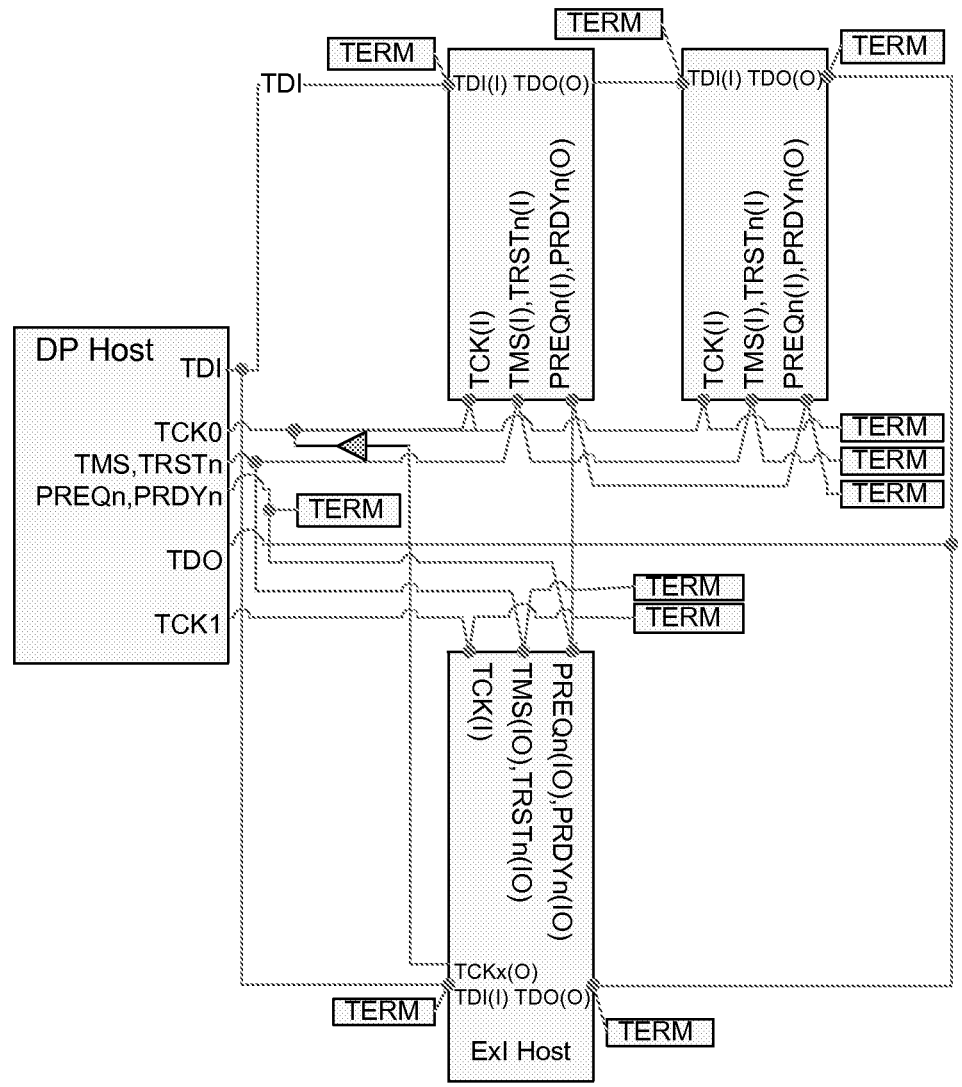
FIG. 11 illustrates an example usage of a shared JTAG chain.

ExI-JTAG is also able to host JTAG onto shared scan-chain topologies on the board, by driving TCK on a GPIO (TCKx), TDI on TDI, TMS on TMS, TRSTn on TRSTn, and recovering TDO on TDO. An example of a shared JTAG chain is shown in FIG. 11.

Figure 12:
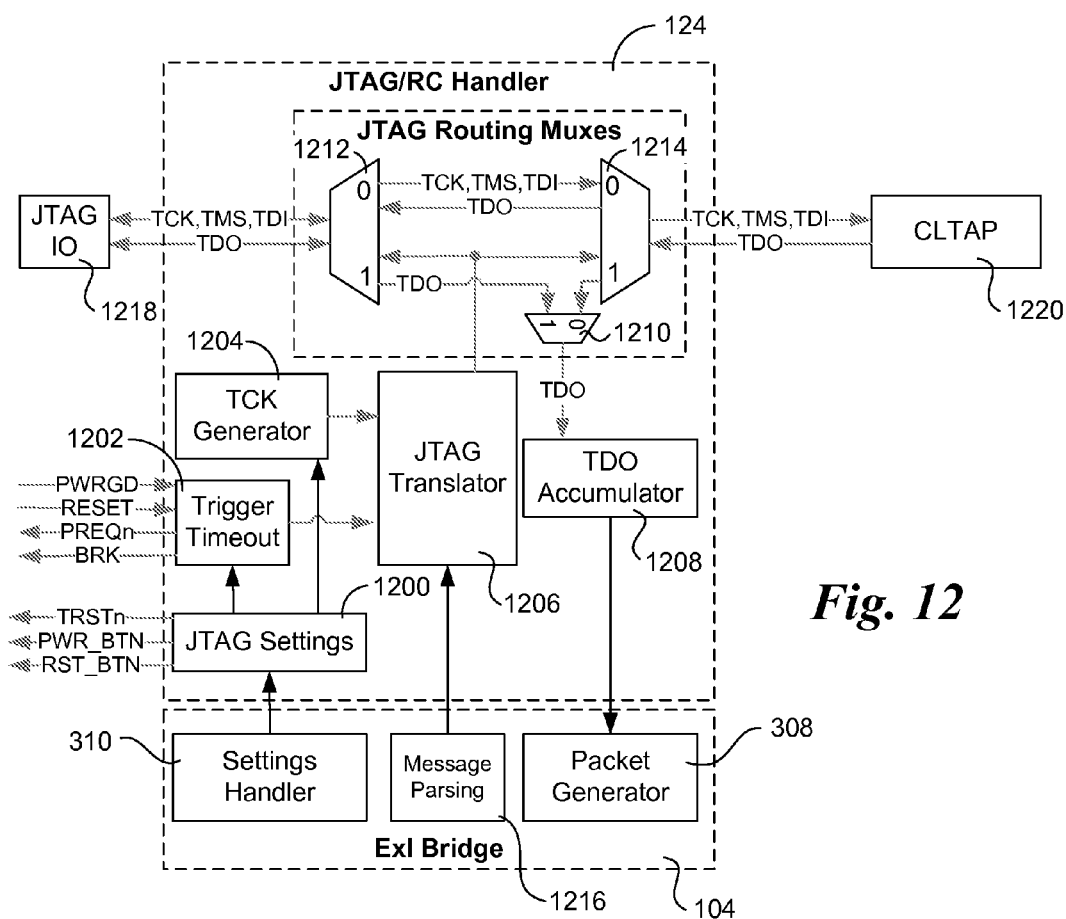
FIG. 12 is a block diagram illustrating selected components of a JTAG/RC handler, according to one embodiment.

FIG. 12 shows selected functional blocks and components employed by JTAG/RC handler 124 to facilitate handler functions. These include a JTAG settings register block 1200, a Trigger Timeout block 1202, a TCK (Test Clock) generator 1204, a JTAG scan translator 1206, a TDO accumulator 1208, and JTAG routing multiplexers 1210, 1212, and 1214. Other blocks and components shown in FIG. 12 include ExI Bridge 104 depicting settings handler 310, packet generator 308, and a message parsing block 1216, as well as a JTAG JO pins 1218 and CLTAP (Chip-Level Test Access Port) logic 1220.

The Inbound data packets arrive in the ExI Bridge input buffer over an applicable interface (e.g., OCP, IOSF, etc.). Each packet contains a header format used to distinguish JTAG protocol packets from other ExI protocol or settings packets. ExI settings packets are used to configure logic within the ExI protocol handlers. For the JTAG handler, a settings packet may configure parameters such as the TCK frequency, triggering, a watchdog timer, the internal or external destination of subsequent JTAG-scans.

The packet parsing block processes the packet header of every ExI packet, and sends the payload either to ExI settings, or to the appropriate DFx protocol handler based on the header's PKT-TYPE value. The JTAG settings register block 1200 contains configuration registers for the ExI Bridge, and each ExI handler, including ExI JTAG. The TCK generator 1204 creates TCK at a specified frequency. The watchdog timer is responsible for identifying hung messages so that any pre-stored TDO data is sent to the host and the Scan-Translator logic can be flushed.

The JTAG scan translator 1206 takes the ExI JTAG payload data and creates JTAG protocol sequences, which are sent through the JTAG-Routing multiplexers. The multiplexer logic either drives JTAG signals into the silicon CLTAP logic 1220, or out the primary JTAG IO pins 1218 to external devices on the common or shared JTAG chains, or out the GPIO pins onto on to additional JTAG chains (not shown). JTAG scan translator 1206 also qualifies recovery of the TDO data for storage in TDO accumulator 1208, which comprises a JTAG write-back block. The write-back block packs TDO data into 64-byte write-back packets and filling data for incomplete write-back packets which occur at the end of scan sequences.

Generally, the interface and packet processing components presented herein for the JTAG/RC handler are illustrative of interfaces and components that may be implemented for other types of ExI handlers, such as those depicted in FIGS. 1 and 1a and discussed above. Of course, each handler would also provide circuitry and logic unique to that handler to facilitate associated test operations.

The techniques disclosed herein may be implemented on a variety of types of computing devices, including desktop computers, servers, laptops, notebooks, netbooks, ultra-books, tablets, handheld computers, mobile phones, internet appliances, set-top boxes, etc. Essentially, aspects of the embodiments disclosed herein may be implemented anywhere JTAG or similar type of testing is performed.

Figure 13:
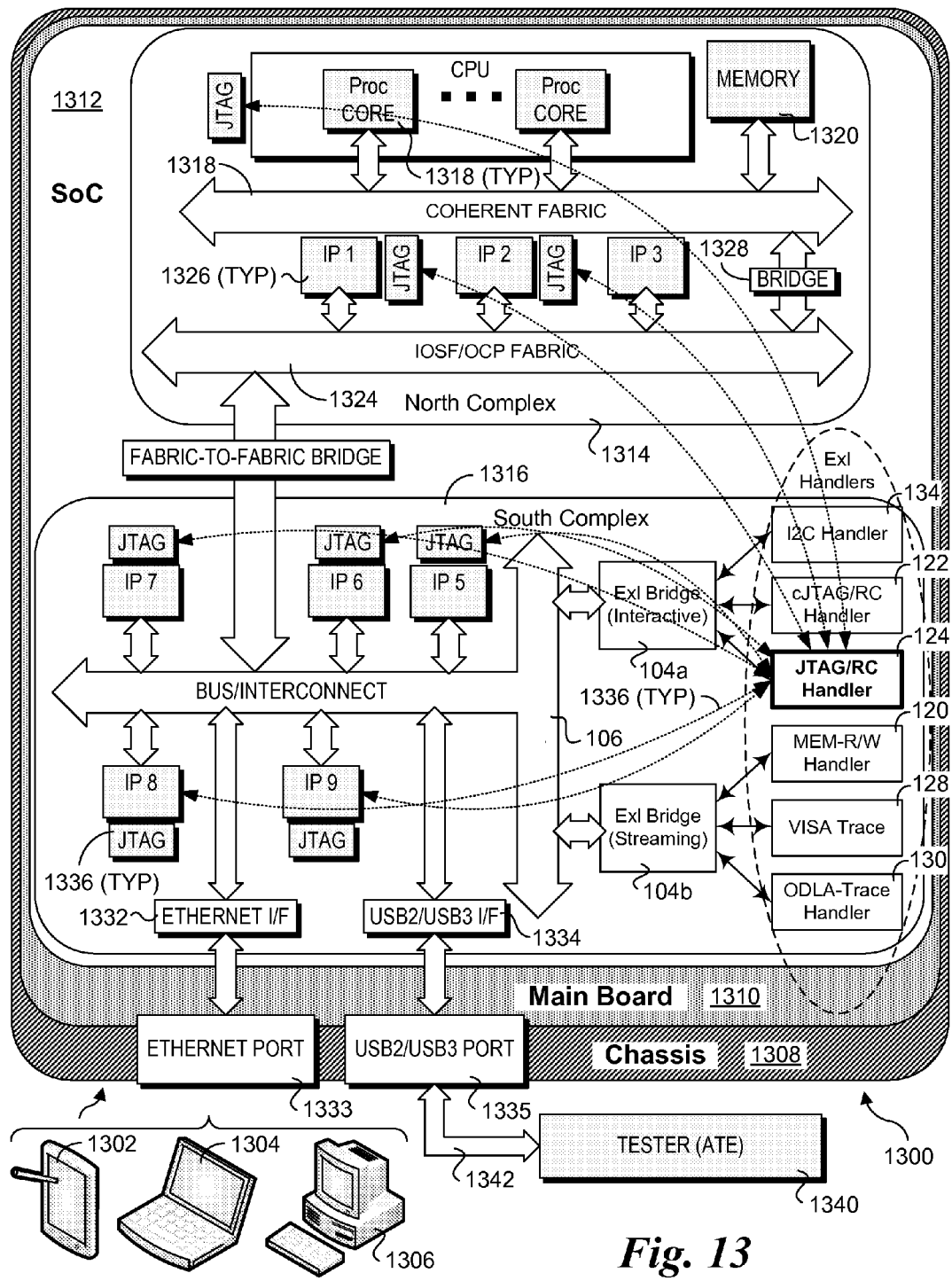
FIG. 13 is a block diagram illustrating details of an exemplary device supporting testing via a standard communication port and including an SoC architecture employing ExI components in accordance with aspects of the embodiments disclosed herein.

For example, FIG. 13 shows an exemplary implementation of the techniques as applied to a computing device 1300, which is illustrative of a tablet 1302, a notebook 1304 and a desktop computer 1306. Each of these devices will typically include a chassis (i.e., housing) in which one or more printed circuit boards (and/or packaging substrates) are housed, including a main board or motherboard having one or more processors and various other types of circuits and components. For simplicity, these are depicted as a chassis 1308 and a main board 1310. The core processing operations are performed by a System on a Chip (SoC) 1312, which is operationally coupled to main board 1310 via a socket connector or through some other type of electromechanical coupling, such as flip-chip bonding.

SoC 1312 is configured in an architecture that is roughly analogous to the ubiquitous North Bridge/South Bridge architecture used in personal computers and the like. However, when implemented on an SoC there are no external bridges, and thus the SoC is logically divided into a "North" complex 1314 and a "South" Complex 1316. The North complex includes high-speed components, such as processor cores, memory, graphic controllers, etc. These are depicted as processor cores 1318 and memory 1320. Memory 1320 is actually illustrative of one or more memory controllers and/or last level caches, as well as corresponding cache coherency agents, as it will be recognized that the primary memory for computing devices of this type would typically comprise of-chip (meaning external to SoC 1312) system memory, which is not shown for simplicity. In turn, each of the processor cores will typically have first and optionally second level caches (also not shown). Alternatively, memory 1320 may also represent SoC on-chip memory.

The use of multiple cores sharing system memory resources invokes the use of some type of memory coherency scheme. This is facilitated, in part, through the use of coherent (interconnect) fabric 1322, which in one embodiment comprises a version of the INTEL® QuickPath Interconnect.

North complex 1314 also includes several components that are coupled to a high speed interconnect, depicted as IOSF/OCP fabric 1324 (meaning fabric 1324 is either an ISOF fabric or an OCP fabric). The components, which may typically include graphics controllers and similar high-speed components, are depicted as Intellectual Property (IP) blocks 1326, labeled IP 1, IP 2, and IP3. As used herein, an IP block is representative of a block or logical group of circuitry that typically serves one or more targeted functions and may comprise logic that is either developed in-house or licensed from a third-party. IP blocks are also referred to as functional blocks. A bridge 1328 is also provided to interface signals between coherent fabric 1318 and IOSF/OCP fabric 1324.

A South complex generally includes various types of IO interfaces and other components that operate at a lower clock rate than those in the North complex. These components will typically be coupled in communication via one or more busses, interconnects and/or interconnect fabrics, which for convenience is collectively depicted as a single Bus/Interconnect 106. Bus/Interconnect 106, in turn, is connected to the North complex via a fabric-to-fabric bridge 1330.

Various IP blocks are shown coupled to Bus/Interconnect 106, labeled IP 5, IP 6, IP 7, IP 8, and IP 9. These IP blocks are illustrative of various components typically found in a South complex, such as IO controllers, audio controllers, disk controllers, and communication interfaces. Also shown are an Ethernet interface (I/F) 1332 and a combination USB2/USB3 interface 1334. These interfaces, in turn, are coupled to physical communication ports/connectors respectively comprising an Ethernet port 1333 and a combination USB2/USB3 port 1335, each of which is mounted on or operationally coupled to main board 1310 and/or chassis 1308 and accessible from outside chassis 1308 (i.e., externally accessible to chassis 1308).

Selected ExI components discussed above with reference to FIG. 1a are also shown as part of South complex 1316. These include an interactive ExI Bridge 104a operatively coupled to an I2C handler 134, a cJTAG/RC handler 122, and a JTAG/RC handler 124, and a streaming ExI Bridge 104b, operatively coupled to a MEM-R/W handler 120, a VISA Trace 128, and an ODLA-Trace handler 130.

For example, for each ExI handler that would be implemented, there will be various logic and interconnect circuitry to facilitate testing operations corresponding to that handler.

In FIG. 13, this circuitry and logic is depicted as JTAG blocks 1336, which are communicatively coupled to JTAG/RC handler 124 as depicted by dotted lines 1338. In general, JTAG blocks 1336 are illustrative of support circuitry for performing various types of testing on the IP blocks and other components in SoC 1312, including scan testing and logic debug testing, as applicable. The various types of testing are well-known in the art and are defined in various corresponding JTAG specification, including but not limited to those referred to herein.

As discussed above, an inventive aspect of the embodiments herein is the enablement of JTAG and other types of testing through the use of industry standard interfaces and other types of ExI hosts in a manner that does not require the use of JTAG debug ports or the like. According, testing may be performed on fully-assembled computing devices, such as those coming off a manufacturing line. Thus, the manufacturer is enabled to perform automated testing of complete computing devices in their chassis prior to shipment.

For example, under the scheme illustrated in FIG. 13, a tester 1340 comprising automated test equipment (ATE) is coupled to USB2/USB3 port 1335 via a USB3 cable 1342. During operation, tester 1340 sends test data and commands as USB packetized data over USB3 cable 1342 to USB2/USB3 port 1335, with the packetized data being forwarded to an applicable ExI Bridge in the manner described above. The ExI Bridge processes the inbound packets and generates ExI packets that are forwarded to an appropriate ExI handler, which in the embodiment of FIG. 13 is JTAG/RC handler 124. The resulting test data generated by JTAG/RC handler is returned to the ExI Bridge, with outbound packets being generated in accordance with the applicable bus/interconnect protocol used to communicate with the USB2/USB3 port. The packets are then forwarded outbound via the USB2/USB3 port 1335 and received at tester 1340, which processes the test results and automatically generates formatted test results. These results will typically be stored onboard the tester, and may be transferred via a communication interface to a computer for storage and/or printout (not shown).

Although the foregoing embodiment employs an ExI bridge, ExI handlers and related components embedded in an SoC, this is merely exemplary and not meant to be limiting. Rather, aspects of the embodiments herein may be implemented in a variety of different types of integrated circuits, such as but not limited to controllers, processors, IO chips and chipsets.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. An integrated circuit, comprising:

circuitry and logic comprising a plurality of functional blocks, communicatively coupled via at least one interconnect including a first interconnect employing a first protocol;

a standard communication interface employing a packet-based protocol, communicatively coupled to the first interconnect;

at least one DFx (design for manufacturability, testability and debuggability) handler, configured to perform testing operations on at least a portion of the circuitry and logic; and a bridge, communicatively coupled to the first interconnect and the at least one DFx handler, configured to, receive inbound test input as packetized data having a packet format in accordance with the first protocol;

process the packetized data and provide corresponding test input packets to a DFx handler identified during processing the inbound test input;

receive test result data from the DFx handler as test packets;

generate outbound packetized data including the test result data and having a format in accordance with the first protocol; and transfer the outbound packetized data to the standard communication interface via the first interconnect.

2. The integrated circuit of claim 1, wherein the standard communication interface comprises a serial interface.

3. The integrated circuit of claim 2, wherein the serial interface comprises a Universal Serial Bus (USB) interface.

4. The integrated circuit of claim 1 wherein the standard communication interface comprises an Ethernet interface.

5. The integrated circuit of claim 1, wherein the at least one DFx handler includes a JTAG (Joint Test Action Group) handler that is configured to perform JTAG-compliant test operations on the integrated circuit.

6. The integrated circuit of claim 1, wherein the first interconnect employs the Open Core Protocol.

* * * * *